United States Patent
Man et al.

(10) Patent No.: US 11,764,098 B2
(45) Date of Patent: Sep. 19, 2023

(54) DETACHING A DIE FROM AN ADHESIVE TAPE BY AIR EJECTION

(71) Applicant: ASMPT SINGAPORE PTE. LTD., Singapore (SG)

(72) Inventors: Ngai Tat Man, Hong Kong (HK); Yiu Ming Cheung, Hong Kong (HK); Jun Qi, Hong Kong (HK); Chi Yung Lee, Hong Kong (HK)

(73) Assignee: ASMPT SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/232,220

(22) Filed: Apr. 16, 2021

(65) Prior Publication Data
US 2022/0336254 A1  Oct. 20, 2022

(51) Int. Cl.
B32B 43/00 (2006.01)
H01L 21/683 (2006.01)

(52) U.S. Cl.
CPC ...... *H01L 21/6838* (2013.01); *H01L 21/6836* (2013.01); *B32B 43/006* (2013.01); *Y10S 156/932* (2013.01); *Y10S 156/943* (2013.01); *Y10T 156/1132* (2015.01); *Y10T 156/1137* (2015.01); *Y10T 156/1179* (2015.01); *Y10T 156/1939* (2015.01); *Y10T 156/1944* (2015.01); *Y10T 156/1983* (2015.01)

(58) Field of Classification Search
CPC . B32B 38/10; B32B 43/006; Y10T 156/1132; Y10T 156/1137; Y10T 156/1179; Y10T 156/1939; Y10T 156/1944; Y10T 156/1983
See application file for complete search history.

(56) References Cited

U.S. PATENT DOCUMENTS 6,709,543 B2 * 3/2004 Kurosawa ........... H01L 21/6835
156/765
6,824,643 B2 * 11/2004 Yoshimoto ........ H01L 21/67132
156/765

(Continued)

FOREIGN PATENT DOCUMENTS

CN 102148142 A 8/2011
KR 20150114789 A 10/2015

(Continued)

OTHER PUBLICATIONS

Lee et al. (KR 2021/0009842) Specification translation (Year: 2019).*

(Continued)

*Primary Examiner* — Linda L Gray
*Assistant Examiner* — Nickolas R Harm
(74) *Attorney, Agent, or Firm* — OSTROLENK FABER LLP (57) ABSTRACT

When picking a die from an adhesive tape, a collet of a pick arm is positioned at a distance over the die, the die being mounted on a first surface of the adhesive tape. A flow of air is then generated onto a second surface of the adhesive surface opposite to the first surface for blowing the adhesive tape to displace the die towards a die-holding surface of the collet. Thereafter, the die is retained on the die-holding surface of the collet while the adhesive tape separates from the die.

16 Claims, 6 Drawing Sheets

(56) References Cited

U.S. PATENT DOCUMENTS

| | | | | |
|---|---|---|---|---|
| 7,306,695 B2* | 12/2007 | Kasai | ............... | H01L 21/6838 438/464 |
| 8,003,495 B2* | 8/2011 | Maki | ............... | H01L 24/29 438/460 |
| 8,092,645 B2* | 1/2012 | Yip | ............... | H01L 21/6838 156/714 |
| 8,221,583 B2* | 7/2012 | Min | ............... | H01L 21/67011 156/707 |
| 9,245,778 B2* | 1/2016 | Yamamoto | ............... | H01L 21/67121 |
| 9,343,338 B2* | 5/2016 | Okamoto | ............... | H01L 21/67271 |
| 2002/0019074 A1* | 2/2002 | Nakazawa | ............... | H01L 21/67132 438/107 |
| 2004/0038498 A1* | 2/2004 | Ozono | ............... | H01L 21/6838 438/464 |
| 2005/0067097 A1* | 3/2005 | Yamamoto | ............... | H01L 21/67092 156/755 |
| 2006/0237142 A1* | 10/2006 | Park | ............... | B29C 63/0013 156/765 |
| 2009/0084499 A1* | 4/2009 | Johnson | ............... | H01L 21/67092 156/765 |
| 2009/0242124 A1* | 10/2009 | Konno | ............... | H01L 21/6838 156/716 |
| 2011/0192547 A1 | 8/2011 | Yip et al. | | |
| 2013/0255889 A1* | 10/2013 | Barmettler | ............... | H01L 21/67132 156/714 |
| 2014/0027049 A1 | 1/2014 | Joo et al. | | |
| 2016/0204017 A1* | 7/2016 | Roesner | ............... | H01L 21/67132 156/60 |
| 2020/0294839 A1* | 9/2020 | Lee | ............... | H01L 21/67132 |
| 2020/0365430 A1* | 11/2020 | Negishi | ............... | B32B 43/006 |

FOREIGN PATENT DOCUMENTS

| | | |
|---|---|---|
| KR | 20160068201 A | 6/2016 |
| KR | 20200049022 A | 5/2020 |
| KR | 20210009842 A | 1/2021 |
| TW | 200428539 A | 12/2004 |

OTHER PUBLICATIONS

European Search Report, dated Aug. 29, 2022, issued in corresponding European Patent Application No. 22165057.

Taiwan Office Action, dated Nov. 14, 2022, issued in corresponding Taiwanese Patent Application No. 111108963. English translation.

* cited by examiner

DETACHING A DIE FROM AN ADHESIVE TAPE BY AIR EJECTION

FIELD OF THE INVENTION

The invention relates to a method of picking a die from an adhesive tape, and an apparatus for carrying out the method.

BACKGROUND

The manufacture of electronic products requires high quality and reliability during the manufacturing process. In particular, process accuracy and consistency are important for semiconductor assembly and packaging equipment. One manufacturing process involves detaching a die from an adhesive tape which typically secures a plurality of dice affixed to that adhesive. Typically, a so-called needle-less ejector tool has an ejector cap able to produce suction via holes located on a top surface of the ejector cap. A singulated thin die attached on the adhesive dicing tape is held down on the ejector cap by suction and a collet from a pick arm holds the die in place. The needle-less ejecting tool comprises multiple movable plates which form a supporting surface underneath the die. The plates are typically formed by multiple pairs of movable plates arranged on both sides of a central plate. The plates are movable to different elevations which can help delaminate the die from the adhesive tape. The collet holds the die in place as the delamination occurs. However, some problems may be encountered when detaching the die from the adhesive tape, such as unintentional damage caused to the die.

It will be beneficial to provide an improved method for picking a die from an adhesive tape as compared to the prior art.

SUMMARY OF THE INVENTION

Thus, it is an object of the invention to seek to provide a method and an apparatus which overcomes at least some of the problems of the prior art.

According to a first aspect of the present invention, there is provided a method of picking a die from an adhesive tape, the method comprising: positioning a collet of a pick arm at a distance over the die, the die being mounted on a first surface of the adhesive tape; generating a flow of air onto a second surface of the adhesive surface opposite to the first surface, for blowing the adhesive tape to displace the die towards a die-holding surface of the collet; and retaining the die on the die-holding surface of the collet while the adhesive tape separates from the die.

The first aspect recognizes that a problem with existing arrangements is that contact between the collet of the pick arm and the die on the ejector cap or other support can cause damage to the die during the delamination process. Accordingly, a method is provided which may be for delaminating and picking a die from an adhesive tape. The method may comprise positioning or locating a collet or a receiving surface of a pick arm at a distance over or away from the die. The die may be mounted on, adhered to or affixed on a first surface of the adhesive tape. The method may comprise generating or producing a flow of air onto a second surface of the adhesive tape. The second surface of the adhesive tape may be opposite or oppose the first surface. The generation of the flow of air may be for blowing the adhesive tape to displace the die towards a holding surface of the collet. The method may comprise retaining or holding the die on the holding surface of the collet while the adhesive tape separates from the die. In this way, the collet can be positioned away from the die, but the die may be propelled onto the holding surface of the collet to separate or delaminate the adhesive tape from the die. This significantly reduces the force on the die and helps to prevent damage.

The second surface of the adhesive tape may be retained or held in position by an ejector cap having a tape-holding suction surface. The blowing may comprise generating the flow of air from the ejector cap to blow or propel the adhesive tape away from the retained position and towards the holding surface of the collet. Hence, the ejector cap may be used to displace the adhesive tape towards the collet.

The separation of the adhesive tape from the die may further comprise generating a suction force from the ejector cap by reversing an airflow through the tape-holding suction surface. This causes a force to be applied on the adhesive tape to delaminate the adhesive tape from the die which is held by the die-holding surface of the collet.

The positioning may comprise positioning the pick arm at a relatively fixed position over the die to maintain a spatial gap between the collet of the pick arm and the die. Again, this prevents a force being applied onto the die which would otherwise squeeze the die between the collet and the ejector cap, potentially causing damage to the die.

The method may comprise, prior to positioning the collet over the die, performing pre-peeling by raising the die and the adhesive tape to apply a peeling force to promote or initiate delamination between the die and the adhesive tape, especially delamination of the adhesive tape from outer edges of the die. This allows the pick arm to be used for other operations while the pre-peeling occurs.

The pre-peeling may comprise repeatedly raising and lowering the die while retaining the adhesive tape in the retained position on the ejector cap to delaminate the adhesive tape from outer edges of the die.

The pre-peeling may also comprise repeatedly raising and lowering the adhesive tape by alternately applying a blowing force and a suction force through the tape-holding suction surface to delaminate the adhesive tape from outer edges of the die. Hence, the edges of the adhesive tape may be peeled while a remainder of the die is held in place to facilitate delamination.

The die may be releaseably supported by ejector plates incorporated in the ejector cap, and the ejector plates may be movable relative to the tape-holding suction surface for raising the die away from the tape-holding suction surface The pre-peeling may comprise raising the die using the ejector plates, or further, the die may be repeatedly raised and lowered using the ejector plates, while retaining the adhesive tape in the retained position on the ejector cap to delaminate the adhesive tape from outer edges of the die. The adhesive tape beyond the outer edges of the die may be held in the retained position while repeatedly raising and lowering the die using the ejector plates to delaminate the adhesive tape from the outer edges of the die. Hence, the adhesive tape beyond the outer edges of the die may be held in place while the die is moved to facilitate delamination.

The raising and lowering of the die may comprise alternately elevating and lowering the ejector plates relative to or with respect to the ejector cap. Typically, such raising and lowering will be towards and away from where the collet would be positioned.

The pre-peeling may comprise alternately generating a blowing force and a suction force through the tape-holding suction surface while the ejector plates are biasing against the adhesive tape to raise the die.

The pre-peeling may comprise repeatedly raising and lowering the adhesive tape extending beyond outer edges of the die while the ejector plates are biasing against the adhesive tape to delaminate the adhesive tape from outer edges of the die.

The ejector plates may include outermost ejector plates adjacent the outer edges of the die and at least one innermost ejector plate adjacent a center of the die and the method may comprise, after pre-peeling, performing peeling by sequentially lowering the outermost elevated ejector plates to apply a peeling force between the adhesive tape and the die to progressively delaminate the adhesive tape from outer edges of the die towards the center of the die.

The peeling may comprise sequentially lowering all the outermost ejector plates except the at least one innermost ejector plate to progressively delaminate the adhesive tape from outer edges of the die towards the at least one innermost ejector plate.

The method may comprise imaging the die during pre-peeling to detect an extent of delamination of the adhesive tape from the die. The absence of the pick arm over the die can assist such imaging.

The imaging may detect the extent of delamination through a degree of image bending of the die following or resulting from application of the peeling force. The imaging may detect the extent of delamination by detecting uniformity of an image of a major surface of the die resulting from application of the pre-peeling force.

The imaging may detect unsuccessful delamination by detecting non-uniformity of an image of a major surface of the die facing away from the ejector cap following application of the pre-peeling force.

The imaging may detect the extent of delamination with an imaging device capturing a side view of the die following or resulting from application of the pre-peeling force.

The imaging device may detect unsuccessful delamination by detecting that the die is bent in side view resulting from application of the pre-peeling force.

The method may comprise repeating the pre-peeling until successful delamination is detected from the imaging of the die.

The method may comprise delaying lowering a next outermost elevated ejector plate until successful delamination is detected following lowering of a preceding outermost elevated ejector plate.

The method may comprise performing the pre-peeling in the absence of the collet positioned over the die.

The method may comprise using the pick arm for at least one of a bonding and a picking operation in relation to another die during the pre-peeling and/or peeling.

According to a second aspect of the present invention, there is provided an apparatus for picking a die from an adhesive tape, comprising: a collet of a pick arm having a die-holding surface configured to be positioned at a distance over the die, the die being mounted on a first surface of the adhesive tape; and an air-flow generator configured to generate a flow of air onto a second surface of the adhesive surface opposite to the first surface to blow the adhesive tape to displace the die towards the die holding surface of the collet to retain the die on the die-holding surface of the collet while the adhesive tape separates from the die.

According to a third aspect of the present invention, there is provided an apparatus configured to perform the method according to the first aspect of the present invention.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Before discussing embodiments in any more detail, first an overview will be provided. Some embodiments provide an arrangement where a die on an adhesive tape is propelled using an air stream onto a pick arm where the die is then delaminated from the adhesive tape. A pre-peeling process typically occurs in the absence of the pick arm, prior to the die being conveyed onto the pick arm in which the adhesive tape is delaminated initially from the edges of the die. This pre-peeling process may be facilitated by reciprocating the die with respect to the adhesive tape. Successful delamination can be detected during pre-peeling using an optical sensor which has an unobstructed view of the die due to the absence of the pick arm. This approach is more reliable than existing techniques that use vacuum leak detection of the pick arm since it is possible that vacuum apertures on the pick arm may be misaligned with the edges of the die. A peeling process typically occurs in the absence of the pick arm, prior to the die being conveyed onto the pick arm in which the adhesive tape is delaminated further from the edges of the die towards its center. This peeling process typically involves moving the die with respect to delaminated portions of the adhesive tape. Successful delamination can be detected during pre-peeling using an optical sensor which has an unobstructed view due to the continued absence of the pick arm. Since the pick arm does not need to be present during the pre-peeling and peeling process, it can be deployed elsewhere which improves the throughput of the pick-up apparatus.

Pick-Up Apparatus

Figure 1:
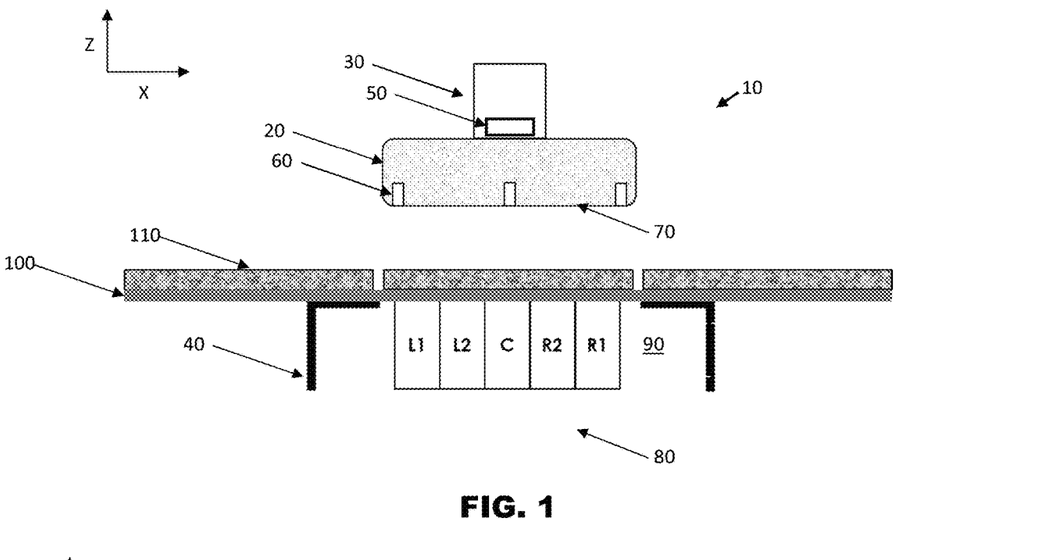
FIG. 1 illustrates the main components of a pick-up apparatus according to one embodiment.

FIG. 1 illustrates the main components of a pick-up apparatus 10 according to one embodiment. The pick-up apparatus 10 comprises a collet 20 of a pick arm 30 arranged for movement along X, Y and Z axes with respect to an ejector cap 40. The pick arm 30 is provided with a force detector 50 which operates to detect a force acting against the collet 20 along the Z axis (typically due to its suction face 70 contacting with a die 110). The collet 20 is provided with a number of suction apertures 60 which operate to suck air to retain a die against the suction face 70.

The ejector cap 40 comprises a plurality of ejector plates 80. The ejector plates 80 sit within an opening of the ejector cap 40. The ejector plates 80 are moveable along the Z axis. Typically, a plurality of ejector plates are moveable simultaneously, in pairs, starting with the outermost pair L1, R1, then the next outermost pair L2, R2, and so on until at least one innermost plate or a central plate C is displaced, as will be explained in more detail below. An airflow device (not shown) operates to generate either a positive or negative air pressure within a plenum 90 of the ejector cap 40, as will be explained in more detail below. An adhesive tape 100 carrying a number of semiconductor dice 110 is received over a receiving surface of the ejector cap 40. Typically, each semiconductor die 110 has a thickness of no more than 50 microns, which causes the die 110 to be fragile and very susceptible to damage.

Ejector Plates

Figure 2A:
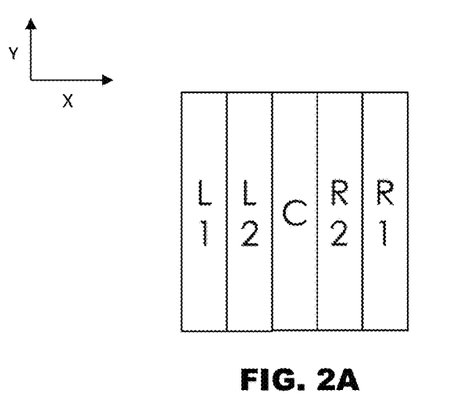
FIG. 2A is a plan view showing the layout of the ejector plates of an ejector cap.
Figure 2B:
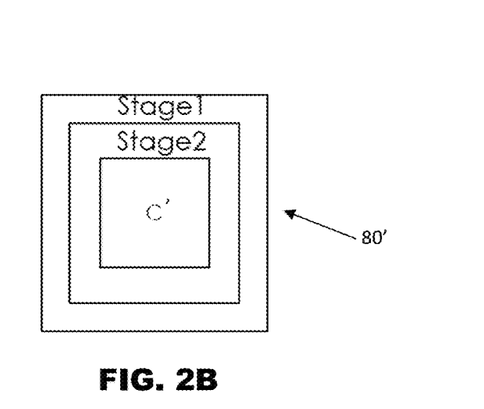
FIG. 2B is a plan view showing an alternative layout of the ejector plates of an ejector cap.

Whilst FIG. 1 shows a side view of the ejector plates 80, FIG. 2A is a plan view showing the layout of the ejector plates 80. FIG. 2B shows an alternative embodiment of ejector plates 80' in which a central plate C' is enclosed concentrically within a stage 2 plate which, in turn, is enclosed concentrically by stage 1 plate. In this arrangement, the stage 1 plate is lowered first, prior to the stage 2 plate being lowered, prior to the central plate being lowered in a similar manner to that described with reference to FIG. 2A.

Figure 8:
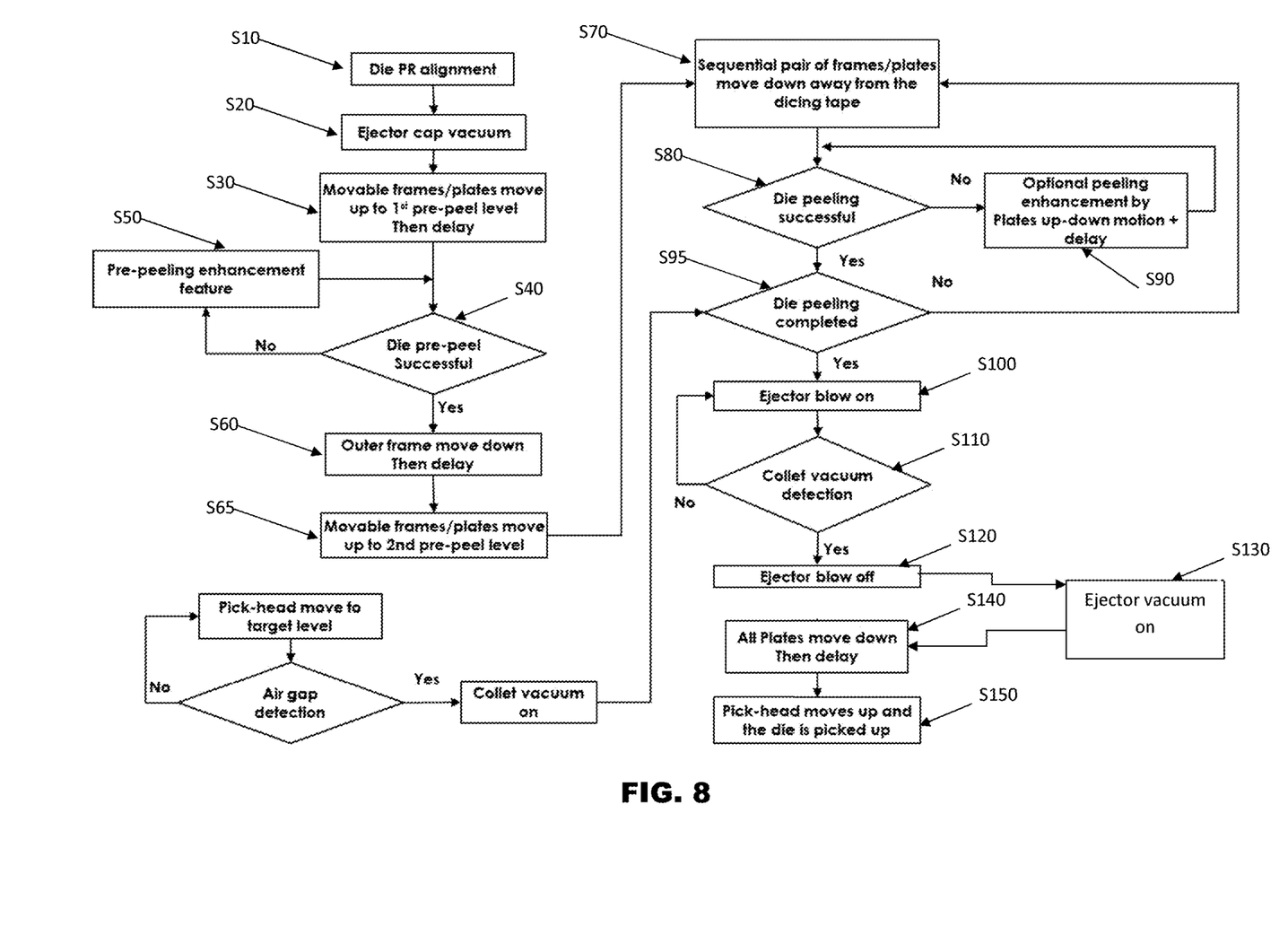
FIG. 8 illustrates an exemplary sequence performed by the pick-up apparatus.

FIGS. 3A to 3E show the operation of the pick-up apparatus according to one embodiment. The sequence performed by the pick-up apparatus is further described with reference to FIG. 8.

Alignment

Prior to commencing a pick-up sequence, the ejector plates 80 are all aligned at a standby level A which is generally flush with a top tape-holding surface of the ejector cap 40. This ensures that the ejector plates 80 do not protrude from the surface of the ejector cap 40. At step S10, using a look-down alignment optical sensor 120 (see FIG. 4A), the die 110 to be picked is located and positioned at a location where the center of the die 110 is aligned with the center of the ejection cap 40. An angular orientation of the die 110 is also aligned with an angular orientation of the ejector cap 40. It will be appreciated that in order to ensure reliable peeling of the die 110 from the adhesive layer 100, there needs to be an appropriate cantilever length between an outer boundary of the ejector plates 80 in the ejector cap and the four edges of the die 110. In other words, the die 110 extends beyond the support offered by the ejector plates 80.

Pre-Peel

Once the alignment has been achieved, a vacuum suction force is applied to the plenum 90 at step S20 and at step S30 the ejector plates 80 are raised to a pre-peel level B by an elevation height H. The vacuum in the plenum 90 provides vacuum suction through holes and slots on the top surface of the ejector cap 40 to pull and hold down the adhesive tape 100 against that top surface of the ejector cap 40 and the ejector plates 80. It will be appreciated that steps S20 and S30 may be reversed or performed simultaneously.

At the given ejector plate elevation height H, the die 110 on the adhesive tape 100 will be pushed upwards away from the top surface of the ejector cap 40 by the protruding ejector plates 80. Since there is a cantilever or overhang between the edge of the die 100 and the outer boundary of the ejector plates 80, the die 110 and the adhesive tape 100 will together be pulled down by the vacuum suction of the ejector cap 40. If the die 110 remains attached to the adhesive tape 100 with no delamination around its edges, the die 110 will bend along its edges due to the vacuum suction on the adhesive tape 100. The bending along the die edges will create a peeling strength between the die 110 and the adhesive tape 100 around its edges. If the peeling strength along the die edges is large enough to overcome the adhesion between the die 110 and the adhesive tape 100, the die 110 will delaminate from the adhesive tape 100, starting with areas around the edges of the die 110. Thus, the die 110 will have its edges opened up and delamination between the die 110 and the adhesive tape 100 will begin at the die edges and propagate inwards until it is stopped by the boundary defined by the next outermost raised ejector plates (in this case, L1, R1).

Figure 3A:
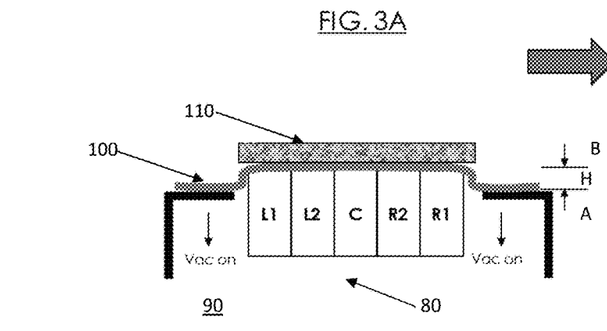
FIGS. 3A to 3E show an operation of the pick-up apparatus.

At step S40, the pre-peel process will be considered successful if all the edges around the die 110 are opened up (meaning that the adhesive tape 100 has begun to peel away from the die 110 along all of those edges). An appropriate delay may be needed to ensure successful pre-peeling by allowing time for the delamination to occur. As can be seen in FIG. 3A, there is no need to position the pick arm 20 above the die 110 being picked during the pre-peel process as well as during the subsequent delamination process.

Figure 4A:
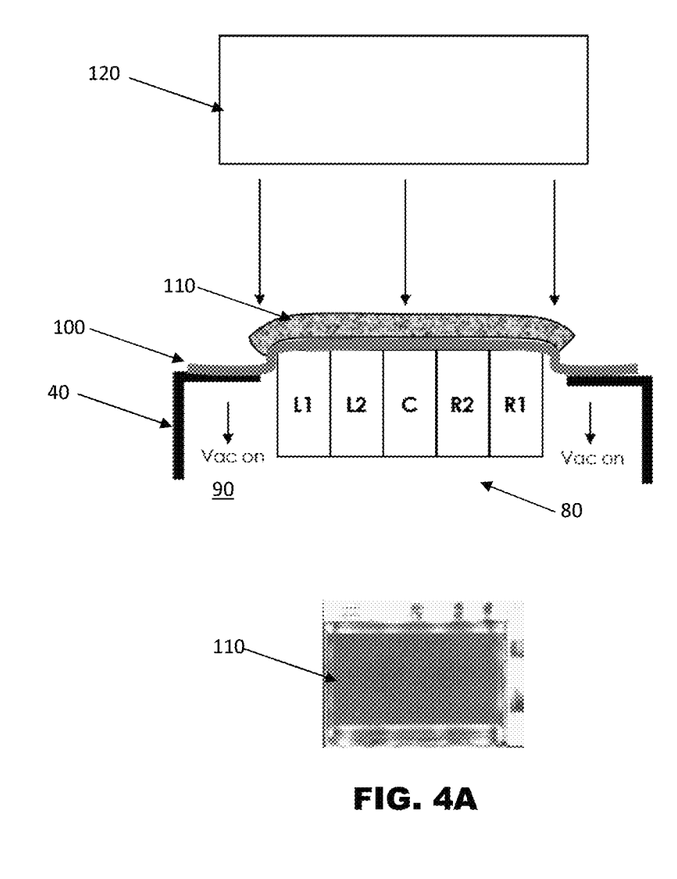
FIG. 4A shows the use of an optical sensor to detect unsuccessful peeling.
Figure 4B:
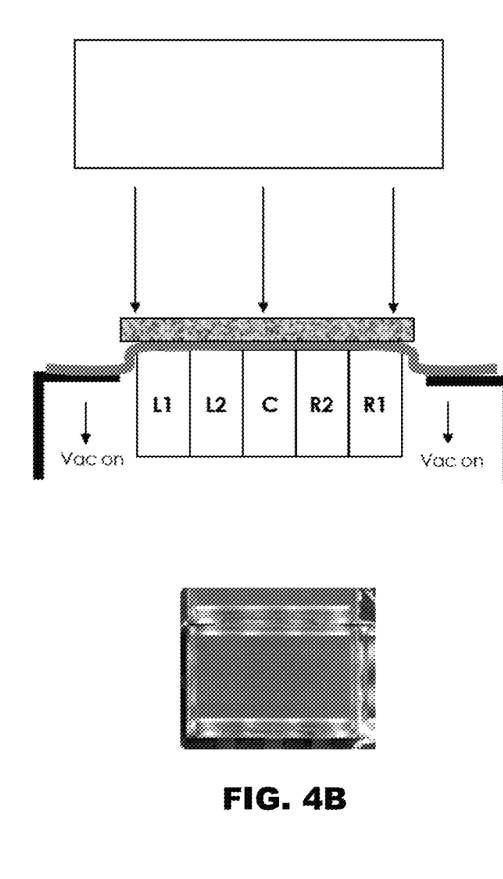
FIG. 4B shows the use of the optical sensor to detect successful peeling.
Figure 5:
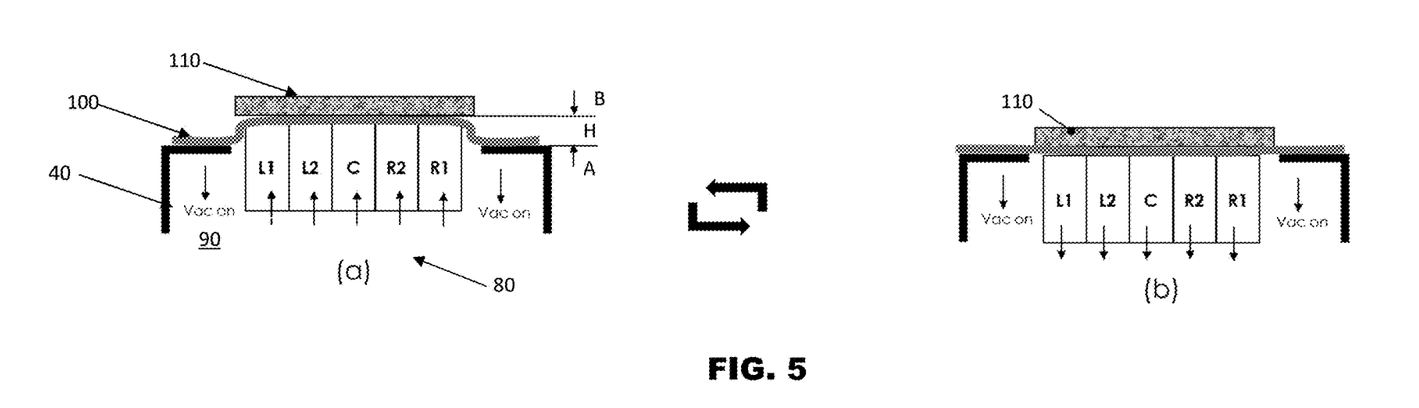
FIG. 5 shows peeling enhancement according to one embodiment.
Figure 6:
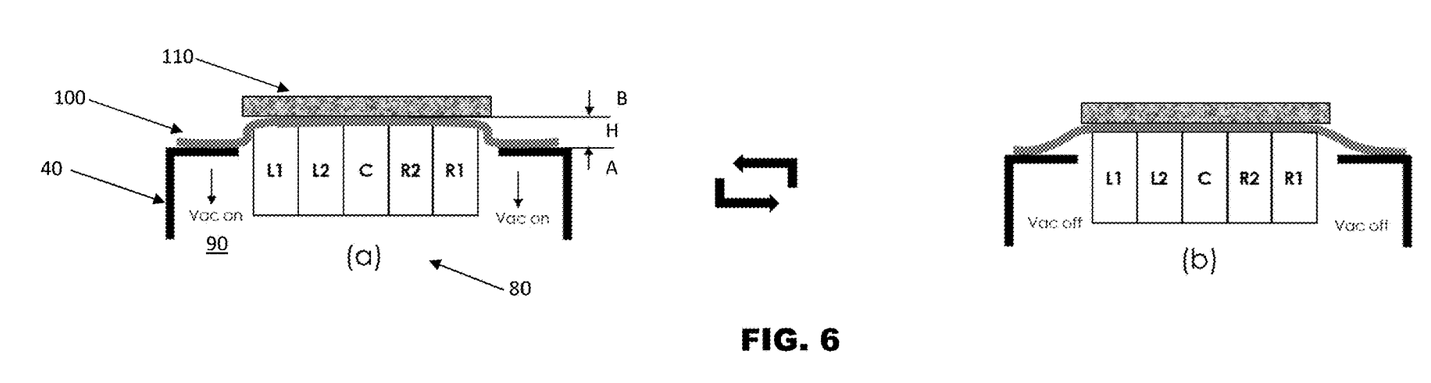
FIG. 6 shows peeling enhancement according to another embodiment.

Given that the presence of the pick arm 30 is not required for the pre-peel and subsequent delamination process, this means that an optical path above the die 110 is not blocked. This enables the optical sensor 120 to be used to image the die 110 to check at step S40 whether the pre-peel process has been successful or not. As can be seen in FIG. 4A, when the pre-peel process is unsuccessful, at least some edges of the die 110 are bent, which can be detected by the optical sensor 120. The presence of bending can be readily detected by the optical sensor 120 by imaging the die 110 and comparing this with images of its adjacent dies and/or by detecting the uniformity of the image of the die or the correlation of the image of the die prior to and after pre-peeling. A difference between these images can indicate the presence of bending of the die 110. Should the pre-peel process not be determined to be successful, as illustrated in FIG. 4A, then a pre-peeling enhancement process can be performed as shown in FIGS. 5 and 6. Should the pre-peel process be determined to be successful, as illustrated in FIG. 4B, then the pre-peeling enhancement process can be omitted.

Pre-Peel Enhancement

At step S50, should the pre-peel process not be determined to be successful, then a pre-peeling enhancement is performed. Creep failure of the adhesive joint can be achieved under repeating cyclic loading at high plastic strains. Adhesive joint failure may occur within a relatively short number of cycles due to the cumulative effect of cyclic shear strains on the adhesive and this effect is more pronounced as it is under low frequency cyclic loading.

As shown in FIG. 5, in one approach, the flow of air in the plenum 90 creates a vacuum section force which pulls the adhesive tape 100 against the top or upper surface of the ejector cap 40. With the vacuum suction force applied, the ejector plates 80 are repeatedly raised and lowered by a distance H between the standby level A and the raised pre-peel level B to provide high strain cyclic loading on the adhesive of the adhesive tape 100. Typically, the distance H is in the order of a few hundred microns and the frequency of this raising and lowering can be in the range from around 1 Hz to 100 Hz. Depending on the vibration amplitude (typically around 300 microns) and the overhanging length of the die 110 extending beyond the ejector plates 80 (typically around 300 microns), a vibration operation lasting for between around 5 to 10 reciprocating cycles should be sufficient to reduce the adhesion of the adhesive and make the pre-peeling process successful.

In an alternative approach, as illustrated in FIG. 6, the vacuum suction force within the plenum 90 is repeatedly switched on and off to provide the high strain cyclic loading on the adhesive of the adhesive tape 100. Again, the plates are raised from their standby level A by a height H to the elevated pre-peel level B and the plates are kept at this elevated position B. The vacuum suction inside the plenum 90 is repeatedly switched on and off at high speed. Typically, the plenum 90 should be as small as possible to facilitate fast switching. The switching rate between the suction flow from vacuum to atmospheric pressure may occur at around 10 to 50 Hz. The vacuum level in the plenum 90 is typically at around −70 to −100 kPa when the vacuum suction in the plenum 90 is applied. The vacuum level in the plenum 90 is at between around 0 to −10 kPa when the vacuum suction in the plenum 90 is released. Also, depending on the height H of the ejector plates 80 (typically around 300 microns) and the overhanging length of the die 110 (being also around 300 microns), operating for between around 5 to 10 vacuum on-and-off cycles should be sufficient to reduce the adhesion of the adhesive and make the pre-peeling process successful, as shown in FIG. 6A.

Figure 7A:
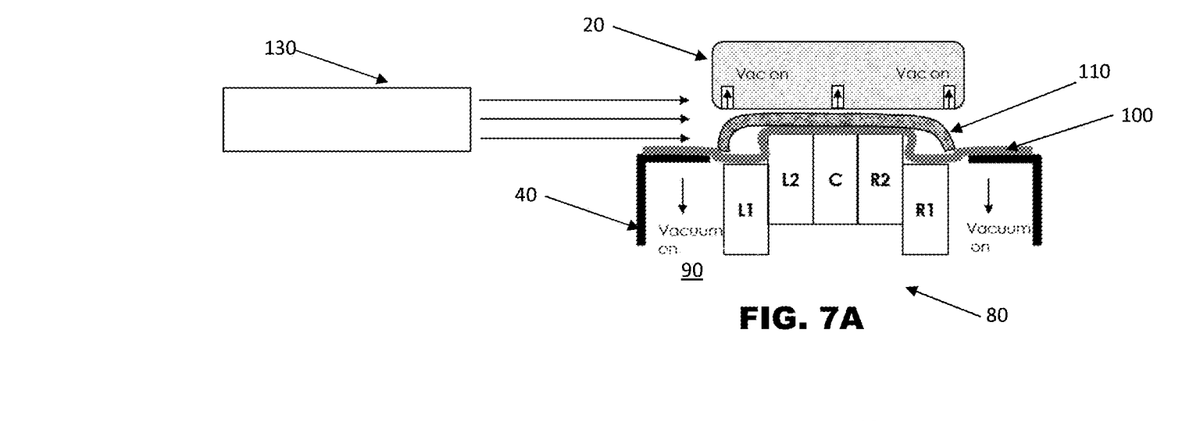
FIG. 7A shows the use of an optical sensor to detect unsuccessful peeling (FIG. 7B) and successful peeling (FIG. 7C)
Figure 7B:
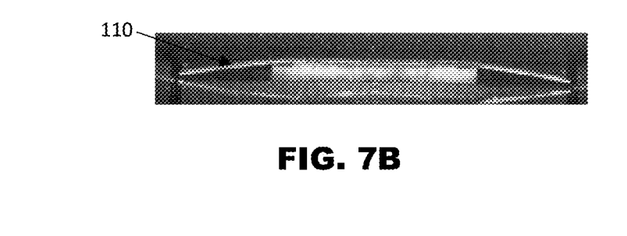
Figure 7C:
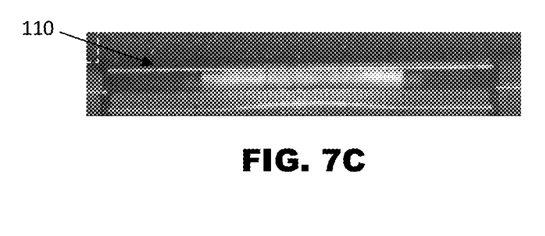

FIG. 7 shows another technique for determining whether pre-peeling is successful. In this arrangement, a side imaging optical sensor 130 is used to determine whether the die 100 is bent (as shown in FIG. 7B (and so has not fully pre-peeled)) or is generally flat (as shown in FIG. 7C) and for which pre-peeling has been successful.

The successful initiation of the pre-peel process is important. If the pre-peel process is not done well and the die edges are not be able to peel off from the adhesive tape 100 (i.e. the die edges are not opened up), then it is unlikely that the subsequent delamination process will succeed. The drop rate for the ejector plates should not be faster than the interfacial delamination propagation speed of the adhesive tape 100 in order to ensure the subsequent delamination propagates along the interface between the die 110 and adhesive tape 100, so that the adhesive tape 110 is completely separated from the overhang portion of the die 100 before the next pair of plates are lowered. The continuation of the interfacial delamination process is driven by the sequential dropping of the outer pair of plates followed by an inner pair of plates, and/or the central plate.

Peeling

Figure 3B:
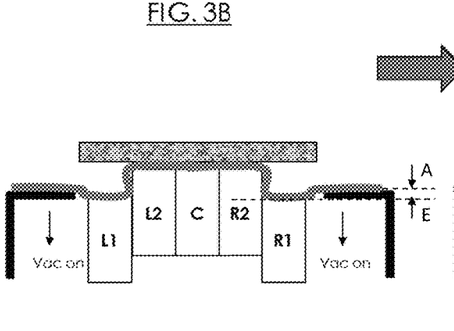

Once pre-peeling has been determined to be successful then, as shown in FIG. 3B, peeling begins at step S60 where the outermost ejector plates L1, R1 are moved down at a predetermined speed to a lower position E which is below the surface of the ejector cap 40. Accordingly, the effective cantilever length of the die 110 is increased by the width of the ejector plates L1, R1 as the boundary of the ejector plates 80 moves inwards to the next pair of outer plates L2, R2. This allows propagation of the delamination between the die 110 and the adhesive tape 100 to progress further into the inner portion of the die 110, as shown in FIG. 3B. With the extending cantilever length, the overhang around the die edges is enlarged. Induced peeling strength can be enhanced at step S65 by raising the raised ejector plates (in this case L2, R2, C) to a height that is above the elevated position B.

If the delamination of this enlarged portion does not occur completely, an area around the edges of the die 110 will be bent and pulled down by a dragging force due to the adhesive tape 100 caused by the vacuum suction by the ejector cap 40 on the adhesive tape 100. Optionally, the optical sensors 120, 130 will determine whether the die 110 is bent around its edges in a similar manner to that described above. Should it be determined that the die 110 is bent, meaning that delamination has not fully occurred, then an additional delay is given to allow for the completion of the delamination.

Figure 3C:
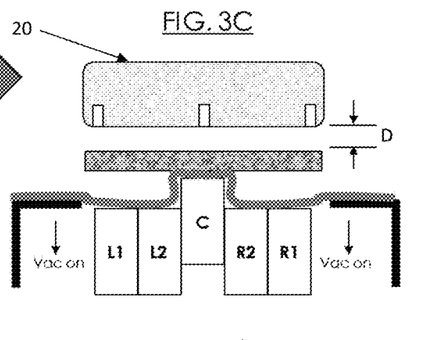

Once delamination has occurred then, at step S70, and as illustrated in FIG. 3C, the next outermost pair of plates L2, R2 will move down to the down position E. Again, an assessment is made each time the plates are lowered, regarding whether successful delamination has occurred by using the optical sensor 120, 130. The plates will be moved down at a programmed speed. Should it be detected at step S80 that successful delamination has not occurred for any of the plates then a delay occurs as mentioned above, and this may be augmented with peeling enhancement at step S90 in a similar manner to that described in FIGS. 5 and 6 to assist peeling.

Die Removal

Once an assessment is made at step S95 that die peeling has been completed and only the central plate C supports the die, as illustrated in FIG. 3C, the collet 20 of the pick arm 30 is positioned over the die 110 and moved down to a target level above the die 110 which leaves an air gap at D between the lower surface of the collet 20 and an upper surface of the die 110. The height of the air gap D is in the order of between around 10 microns and 100 microns. Since the collet 20 does not land on the die 110, there are no undesirable compressive forces acting on the die 110 by the collet 20 at this time.

Figure 3D:
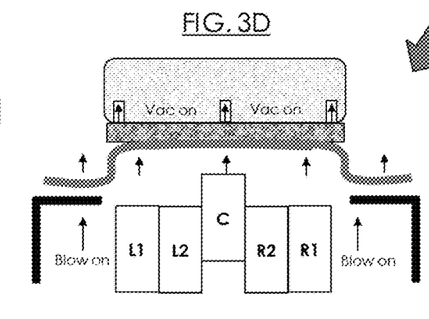

After the collet 20 reaches the correct height above the die, then at step S100 the air flow within the plenum 90 is reversed to provide an air blow to the region of the ejector cap 100 beneath the adhesive tape 100. The adhesive tape 100 together with the die 110 is lifted by bulging of the adhesive tape 100 which closes the air gap D between the die 110 and the collet 20. The collet 20 will receive the die 110 and hold it in position by vacuum suction through the apertures 60, as illustrated in FIG. 3D. At step S110, the presence of the die 110 against the collet 20 is detected by an increase in the vacuum within the apertures 60. This causes the air blow to be switched off at step S120.

Figure 3E:
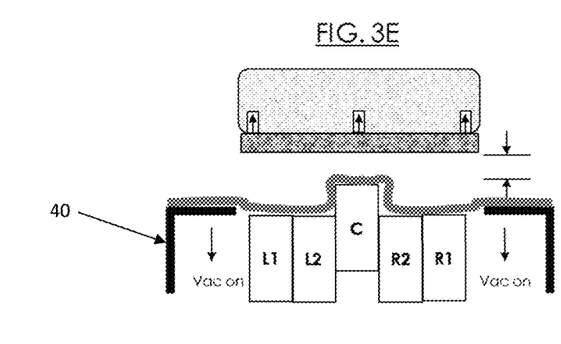

Once the collet 20 has received the die 110, the air flow within the plenum 90 is reversed at step S130 which causes vacuum suction to be applied within the plenum 90, thus pulling the adhesive tape 100 from the die 110 and onto the surface of the ejector cap 40, as illustrated in FIG. 3E. The collet 20 is now holding the die 110, which is completely separated from the adhesive tape 100. At step S140, the final plate C is then lowered within the ejector cap 40, in preparation for the next pick-up cycle. The ejecting sequence for the die 110 is now complete and the pick arm 30 can move to place the die 110 at the required location (step S150).

Hence, it can be seen that the embodiments of the invention described herein improve the die pick-up success rate by adding an optical inspection feedback system to detect unsuccessful delamination and implement remedial actions. Removing the need for the presence of the pick arm 30 on top of the die 110 during the die detachment process allows the use of optical means to detect incomplete delamination right above the die 110 being picked. The likelihood of a successful pre-peeling process is increased by adding a cycling shear loading on the adhesive tape 100 so as to reduce the interfacial adhesion between the die 110 and the adhesive tape 100. Meanwhile, the pick arm 30 is allowed to conduct other parallel operations and hence increase the throughput of the pick-up apparatus 10 since the pick arm 30 does not need to remain at the position of the die 110 during the die detachment process. The compressive force acting on die 110 by the pick arm 30 is also reduced by adopting the new die receiving process, which blows air from underneath the adhesive tape 100 to create a bulge in the adhesive tape 100.

Although the present invention has been described in considerable detail with reference to certain embodiments, other embodiments are possible. Therefore, the spirit and scope of the appended claims should not be limited to the description of the embodiments contained herein.

The invention claimed is:

1. A method of picking a die from an adhesive tape, the method comprising:
   positioning a collet of a pick arm at a distance over the die, the die being mounted on a first surface of the adhesive tape;
   generating a flow of air onto a second surface of the adhesive tape opposite to the first surface, for blowing the adhesive tape to displace the die towards a die-holding surface of the collet, wherein the second surface of the adhesive tape is retained in a retained position by an ejector cap comprising a tape-holding suction surface, and the blowing comprises generating the flow of air from the ejector cap to propel the adhesive tape away from the retained position towards the die-holding surface of the collet, and wherein the die is releasably supported by ejector plates incorporated in the ejector cap, the ejector plates being movable relative to the tape-holding suction surface for raising the die away from the tape-holding suction surface; and
   retaining the die on the die-holding surface of the collet while the adhesive tape separates from the die.

2. The method of claim 1, wherein the separation of the adhesive tape from the die further comprises generating a suction force from the ejector cap by reversing an air flow through the tape-holding suction surface.

3. The method of claim 1, wherein the positioning comprises positioning the pick arm at a relatively fixed position over the die to maintain a spatial gap between the collet of the pick arm and the die.

4. The method of claim 1, further comprising, prior to positioning the collet over the die, performing pre-peeling by raising the die and the adhesive tape to apply a peeling force to initiate delamination of the adhesive tape from outer edges of the die.

5. The method of claim 4, wherein the pre-peeling further comprises repeatedly raising and lowering the die while retaining the adhesive tape in a retained position on an ejector cap to delaminate the adhesive tape from outer edges of the die.

6. The method of claim 4, wherein the pre-peeling further comprises repeatedly raising and lowering the adhesive tape by alternately applying a blowing force and a suction force through the tape holding suction surface to delaminate the adhesive tape from outer edges of the die.

7. The method of claim 4, comprising imaging the die during or after pre-peeling to detect an extent of delamination of the adhesive tape from the die.

8. The method of claim 7, wherein the imaging detects the extent of delamination through a degree of imaged bending of the die following application of the peeling force.

9. The method of claim 7, wherein the imaging detects the extent of delamination with an imaging device capturing a side view of the die following application of the pre-peeling force.

10. The method of claim 7, comprising repeating the step of pre-peeling until successful delamination is detected from the imaging of the die.

11. The method of claim 4, comprising performing the pre-peeling in the absence of the collet positioned over the die.

12. The method of claim 1, further comprising, prior to positioning the collet over the die, performing pre-peeling by raising the die using the ejector plates to initiate delamination of the adhesive tape from outer edges of the die.

13. The method of claim 12, wherein the die is repeatedly raised and lowered by the ejector plates by alternately elevating and lowering the ejector plates relative to the tape-holding suction surface of the ejector cap.

14. The method of claim 12, wherein the pre-peeling comprises alternately generating a blowing force and a suction force through the tape-holding suction surface while the ejector plates are biasing against the adhesive tape to raise the die.

15. The method of claim 12, wherein the ejector plates include outermost ejector plates adjacent the outer edges of the die and at least one innermost ejector plate adjacent a center of the die, the method further comprising, after pre-peeling, performing peeling by sequentially lowering the outermost elevated ejector plates to apply a peeling force between the adhesive tape and the die to progressively delaminate the adhesive tape from outer edges of the die towards the center of the die.

16. The method of claim 15, wherein said peeling comprises sequentially lowering all the outermost ejector plates except the at least one innermost ejector plate to progressively delaminate the adhesive tape from outer edges of the die towards the at least one innermost ejector plate.

* * * * *